(12) United States Patent
Seidel et al.

(10) Patent No.: US 10,896,823 B2
(45) Date of Patent: Jan. 19, 2021

(54) LIMITED DOSE ATOMIC LAYER PROCESSES FOR LOCALIZING COATINGS ON NON-PLANAR SURFACES

(71) Applicants: Thomas E. Seidel, Palm Coast, FL (US); Michael Current, San Jose, CA (US)

(72) Inventors: Thomas E. Seidel, Palm Coast, FL (US); Michael Current, San Jose, CA (US)

(*) Notice: Subject to any disclaimer, the term of this patent is extended or adjusted under 35 U.S.C. 154(b) by 0 days.

(21) Appl. No.: 16/665,940

(22) Filed: Oct. 28, 2019

(65) Prior Publication Data
US 2020/0161140 A1    May 21, 2020

Related U.S. Application Data

(60) Provisional application No. 62/770,502, filed on Nov. 21, 2018, provisional application No. 62/794,758, filed on Jan. 21, 2019.

(51) Int. Cl.
| | | |
|---|---|---|
| *H01L 21/311* | (2006.01) | |
| *H01L 21/02* | (2006.01) | |
| *G01T 3/00* | (2006.01) | |

(52) U.S. Cl.
CPC .... *H01L 21/31116* (2013.01); *H01L 21/0228* (2013.01); *G01T 3/00* (2013.01)

(58) Field of Classification Search
CPC .......... H01L 21/31116; H01L 21/0228; H01L 21/32135; H01L 21/31122; H01L 29/66795; G01T 3/00
See application file for complete search history.

(56) References Cited

U.S. PATENT DOCUMENTS

| | | | |
|---|---|---|---|
| 6,413,802 B1 | 7/2002 | Hu et al. | |
| 7,344,953 B2 | 3/2008 | Hecht et al. | |
| 7,981,473 B2 | 7/2011 | Kim et al. | |
| 8,778,715 B2 | 7/2014 | Bellinger et al. | |
| 9,355,839 B2* | 5/2016 | Swaminathan | ... C23C 16/45527 |
| 9,502,238 B2* | 11/2016 | Danek | ............... C23C 16/45544 |
| 10,381,227 B2 | 8/2019 | George et al. | |
| 2006/0266478 A1* | 11/2006 | Lee | .......................... C23F 4/00 |
| | | | 156/345.24 |
| 2016/0203995 A1* | 7/2016 | Kanarik | ............ C23C 16/45527 |
| | | | 438/703 |
| 2018/0061628 A1* | 3/2018 | Ou | ...................... H01L 21/3065 |
| 2019/0080919 A1* | 3/2019 | Tapily | ............... H01L 21/02274 |

(Continued)

OTHER PUBLICATIONS

Abdulagatov, A.I.; et al., "Thermal Atomic Layer Etching of Silicon and Silicon Nitride Using an Oxidation and "Conversion-Etch" Mechanism", AVS International Symposium & Exhibition, Long Beach, Oct. 21-26, 2018, 36 pgs.

(Continued)

*Primary Examiner* — Anita K Alanko
(74) *Attorney, Agent, or Firm* — Ascenda Law Group, PC (57) ABSTRACT

Processes for localized film deposition on semiconductor device surfaces having non-planar features. The processes use combinations of Limited-Dose Atomic Layer Etch, Limited Dose Atomic Layer Deposition, and Atomic Layer Deposition to provide localized coatings only near or on the bottom, or only near the center, or only near or on the top and bottom of trench and Fin features.

5 Claims, 8 Drawing Sheets

(56) References Cited

U.S. PATENT DOCUMENTS

2019/0382897 A1* 12/2019 Tabata .................. C23C 16/52
2020/0035503 A1* 1/2020 Tabata .............. H01J 37/32449

OTHER PUBLICATIONS

Cremers, V.; et al., "Conformality in atomic layer deposition: Current status overview of analysis and modelling", Appl. Phys. Rev. (2019), 6:021302-1-021302-43.

Current, M.I., "Perspectives on Low-Energy Ion (and Neutral) Implantation", Proc. 17th International Workshop on Junction Technology, IEEE, Jun. 2017, Uji, Japan, 7-12 (2017), 6 pgs.

Dumont, J.W.; et al., "Thermal Atomic Layer Etching of SiO2 by a "Conversion-Etch" Mechanism Using Sequential Reactions of Trimethylaluminum and Hydrogen Fluoride", ACS Appl. Mater. Interfaces (2017), 9:10296-10307.

Elam; et al., "Conformal Coating on Ultrahigh-Aspect-Ratio Nanopores of Anodic Alumina by Atomic Layer Deposition", Chem. Mater. (2003), 15(18):3507-3517.

Faraz, T.; et al., "Energetic ions during plasma-enhanced atomic layer deposition and their role in tailoring material properties", Plasma Sources Sci. Technol.(Feb. 28, 2019), 28(024002), 20 pgs.

Gutsche, M.; et al., "Capacitance Enhancement Techniques for Sub-100nm Trench DRAMs", IEDM Tech. Dig. (2001), 4 pgs.

Johnson, N.R.; et al., "WO3 and W Thermal Atomic Layer Etching Using "Conversion-Fluorination" and "Oxidation-Conversion-Fluorination" Mechanisms", ACS Appl. Mater. Interfaces (2017), 9:34435-34447.

Kanarik, K. J. et al., "Atomic Layer Etching: Rethinking the Art of Etch", J. Phys. Chem. Lett. (2018), 9:4814-4821.

Knoops, C. M. et al., "Conformality of Plasma-Assisted ALD: Physical Processes and Modeling", Journal of the Electrochemical Society (2010), 157(12):G241-G249.

Lee Y.; et al., "Trimethylaluminum as the Metal Precursor for the Atomic Layer Etching of Al2O3 Using Sequential, Self-Limiting Thermal Reactions", Chem. Mater. (2016), 28:2994-3003.

Lee, D-H; et al., "Removal of Aspect-Ratio-Dependent Etching by Low-Angle Forward Reflected Neutral-Beam Aching", J. Korean Physical Society (2005), 46(4):867-871.

Lee, Y; et al., "Thermal Atomic Layer Etching of Titanium Nitride Using Sequential, Self-Limiting Reactions: Oxidation to TiO2 and Fluorination to Volatile TiF4", Chem. Mater. (2017), 29:8202-8210.

Lee, Y. et al., "Selectivity in Thermal Atomic Layer Etching Using Sequential, Self- Limiting Fluorination and Ligand-Exchange Reactions", Chem. Mater. (2016), 28:7657-7665.

Mane, A.; et.al., "AA2-WeA-6 Fluorine Free Boron-Containing Composite Layers for Shallow Dopant Source Applications", Abstract for Paper AA2-WeA6, ALD 2019-Seattle, (Jul. 24, 2019), 3 pgs.

Mane, A.U.; et al., "Atomic layer deposition of boron-containing films using B2F4", J. Vac. Technol. (2016), A34 (1):01A132-1-01A132-5.

Oehrlein, G.S. et al., "Atomic Layer Etching at the Tipping Point: An Overview", ECS J. of Solid State Sci. and Tech. (2015), 4(6):N5041-N5053.

Park, SD; et al., "Atomic Layer Etching of Si(100) and Si(111) Using Cl2 and Ar Neutral Beam", Electrochemical and Solid State Letters (2005), 8(8):C106-C109.

Sprenger; et al., "Electron-Enhanced Atomic Layer Deposition of Boron Nitride Thin Films at Room Temperature and 100 ° C.", J. Phys. Chem. C (2018), 122:9455-9464.

Sprenger, J.K., "Electron Enhanced Atomic Layer Deposition (EE-ALD) for Room Temperature Growth of Gallium Nitride, Silicon, and Boron Nitride Films", Thesis, University of Colorado, Department of Chemisty (2017), 153 pgs.

Kim; et al., "A Process for Topographically Selective Deposition on 3D Nanostructures by Ion Implantation", ACS Nano (2016), 10, 4451, 15 pgs.

Zheng, P., "Advanced MOSFET Structures and Processes for Sub-7 nm CMOS Technologies," Thesis, UCB (2016), Technical Report No. UCB/EECS-2016-189, 74 pgs.

* cited by examiner

LIMITED DOSE ATOMIC LAYER PROCESSES FOR LOCALIZING COATINGS ON NON-PLANAR SURFACES

RELATED APPLICATIONS

This is a NONPROVISIONAL of, incorporates by reference, and claims the priority benefit of U.S. Provisional Application 62/770,502, filed Nov. 21, 2018, and U.S. Provisional Application 62/794,758, filed Jan. 21, 2019.

FIELD OF THE INVENTION

The present invention relates to processes for localized film deposition on semiconductor device surfaces having non-planar features using combinations of Limited-Dose Atomic Layer Etch, Limited Dose Atomic Layer Deposition, and Atomic Layer Deposition.

BACKGROUND

Atomic Layer Deposition (ALD) provides conformal coatings of uniform thickness over an entire surface structure, using self-limiting processes and fully saturating doses. These structures can be non-planar trenches or arrays of trenches (Gutsche, M. et al., IEDM Tech. Dig., (2001) p. 411), or non-planar Fins or arrays of Fins, (Hu, C. et al., U.S. Pat. No. 6,413,802). Trench (or hole) and Fin (or pillar) features are illustrated in cross-section schema in FIGS. 1a and 1b, respectively.

However, if the ALD dose is limited and less than the dose required to allow reacting chemical precursors to reach the bottom or remote locations of the features is applied, then only the top of the feature or near top of the feature will be coated. This ALD capability to deposit localized coatings is described in e.g., Kim (U.S. Pat. No. 7,981,473) and Hecht (U.S. Pat. No. 7,344,953). The Kim patent describes limited doses for obtaining higher film deposition rates, based on the ability to reduce purge times. The Hecht patent describes limited ALD doses for deposition of a localized mask coatings on the top portion of a trench for improving DRAM capacitance. Both Kim and Hecht illustrate localized coatings near the top of trench structures. See, e.g., FIGS. 3 and 4 of Kim, and FIGS. 1B and 1D of Hecht. To the knowledge of the inventors, there have been no reports of using Limited Dose Atomic Layer Etch (LD-ALEt) and no descriptions of process combinations using ALD, Limited Dose ALD (LD-ALD) and Limited Dose ALEt (LD-ALEt.

Atomic Layer Etching (ALEt) processes are, in some respects, like ALD, but instead of growing a film, layer-by-layer the surface is etched, layer-by-layer. Thermal ALEt processes modify the surface to be etched under exposure of a first precursor so that when the modified surface is exposed to a second precursor, a few monolayers, a monolayer, or a fraction of monolayer of the material to be etched is removed in the by-products of the second precursor reaction. ALEt has many varieties. ALEt may be by thermal processes where both half-reactions are thermal (T-ALEt), or a process where one of the half reactions may be plasma assisted ALEt (PA-ALEt). The thermal process is isotropic and the plasma assisted process may be anisotropic because of the directionality of the ion process. For the purposes of this disclosure, ALEt may be thermal or plasma assisted.

Processes for thermal ALEt have been described for several materials. For ALEt of $Al_2O_3$, the surface is exposed to HF for modification by conversion of Al—O to $AlF_3$ and the $AlF_3$ layer is subsequently removed by exposure to Trimethylaluminum (TMA) resulting in the etching of $Al_2O_3$ through $AlF(CH_3)$ in the by-product leaving molecules. This ALEt process is a thermal, self-limiting saturating, temperature dependent in a window from 250-350° C. At 150° C., there is only $AlF_3$ conversion and etching does not occur. In addition to $Al_2O_3$, $ZrO_2$ and $HfO_2$ can be converted to metal-$F_x$ layers using HF and then etched using $Sn(acac)_2$. However, for SiO2, SiN or TiN, thermal ALEt does not occur for the HF-TMA or HF—$Sn(acac)_2$ chemistries, so if these materials were concurrently present on the substrate, they would (selectively) not etch, while $Al_2O_3$, $ZrO_2$, and $HfO_2$ would etch. (Lee, Y. et al., Chem. Mater. 28, 7657 (2016)).

For $SiO_2$, a modification process using exposure to TMA converts the surface to $Al_2O_3$, followed by HF that converts $Al_2O_3$ to $AlF_3$, which is then etched by TMA; using the same process as for pure $Al_2O_3$. Both conversion to $Al_2O_3$ and the removal of $Al_2O_3$ are self-limiting, saturating processes. (DuMont, J. W. et al., ACS Appl. Mater. Interfaces, 9, 10296-10307 (2017)).

For ALEt of TiN a modification process uses $O_3$ to convert the surface to $TiO_2$ with $N_2$ or NO as by-products; this is followed by self-limiting reaction of HF that has $TiF_4$ and $H_2O$ as by-products. (Lee, Y and George, S. M., Chem. Mater. 29, 8202 (2017)). For Si or SiN, $O_3$ converts the surface to $SiO_2$, followed by TMA to convert the surface to $Al_2O_3$, followed by HF to convert to $AlF_3$, which is then etched by TMA, (Abdulagatov, A. I. and George, S. M., AVS International Symposium & Exhibition, Long Beach, Oct. 21-26, 2018).

For W, a modification process uses $O_3$ to convert the surface to $WO_3$, (perhaps not entirely self-limiting), which is then modified again using a self-limiting $BCl_3$ exposure to convert the surface to $B_2O_3$, which then is etched away using HF, having $BF_3$ and $H_2O$ as leaving products. An etch rate of 2.4 A/cycle was reported for this process, (Johnson, N. R. and George, S. M., ACS Appl. Mater. Interfaces 9, 34435 (2017)).

If desired, it is important to have selectivity between the material being etched and the substrate upon which the etched film is resting. So, for example, a film etched on elemental silicon will not etch the silicon.

Broad ALEt chemistries have been described in patent applications by Lee and George (U.S. application Ser. No. 15/534,215, which claims priority to 62/154,994 and 62/093,595). The disclosure recites the use of thermal ALE processes for application to three dimensional (3D) structures, but does not describe or disclose the use of limited doses to localize etching and does not describe the use of limited doses of a variety of atomic layer processes for the attainment of localized coatings on non-planar structures as described in this disclosure.

Under certain circumstances, gates (and Fins as well) in FinFET structures might be expected to have side-wall coatings. Spacer films are locally applied to the FinFET gates to mask Lightly Doped Drain (LDD) doping and offset the source-drain doping of the Fin. (Hu, U.S. Pat. No. 6,413,802) In the current disclosure, the localized coating on the foot of the Fin is illustrated as an application of a limited dose process. Also doped oxides may be used for FinFET source drain doping by out diffusion from the doped layers, (Mane, A. U. et al., J. Vac. Technol. A34(1) (2016) 01A132-1). The doped oxide films may be locally deposited using limited dose ALEt masking processes.

Devices such as solid-state neutron detectors (Bellinger, U.S. Pat. No. 8,778,715) may have a microstructure design modified to capture more nuclear reaction products for efficiency improvement using limited dose processes. A bottle structure located in the middle of a trench for improved neutron detection efficiency is illustrated.

SUMMARY OF THE INVENTION

The present invention describes sequential combination ALD and ALEt process steps, using limited dose ALD etching in at least one of the steps to provide localized film coatings on trench (or hole) and Fin (or pillar) non-planar device structures. Examples, such as localized coatings only near the bottom, or only in the middle, or only at the top and bottom of vertical structures are described and illustrated. Selected applications are also described.

A method is described to deposit a film locally near the bottom of a non-planar trench or Fin feature. The approach is based on limiting the dose of a modifying precursor step during ALEt process, so a conformal film is etched only near the feature upper surface.

Additionally, a method is described to deposit a film only at the middle of a non-planar trench or Fin feature. A limited dose ALD process is followed by a Limited Dose ALEt step, Further, a method is described to deposit a film locally only near the top and bottom of a non-planar trench of Fin feature. A limited dose ALEt step removes the center and top coating of a conformal coating, which is followed by a limited dose ALD step to deposit a film near the top of the feature.

BRIEF DESCRIPTION OF THE DRAWINGS

The present invention is illustrated by way of example, and not limitation, in the figures of the accompanying drawings, in which.

DETAILED DESCRIPTION

In accordance with embodiments of the present invention, a process for fabricating a portion of a device having a non-planar trench or Fin feature includes a first step of coating the feature with a uniform thickness film by a first ALD or conformal chemical vapor deposition (CVD) process, followed by a second step of removing at least a portion of the film near a top of the feature using a prescribed LD-ALEt process, thereby leaving a residual film coating only near a bottom of the feature.

Also described is a process for fabricating a portion of a device having a non-planar trench or Fin feature, which process includes a first step of coating, using a prescribed LD-ALD process, the feature with a film only near a top and center of the feature, followed by a second step of using a different prescribed LD-ALEt process to remove a portion of the film at a top of the feature, thereby leaving a localized film coating only near a center of the feature.

Also described is a three-step process for fabricating a portion of a device having a non-planar trench or Fin feature, which process includes a first process step of coating, with a first conformal ALD process, a uniform film on a surface of the feature, followed by a second process step of removing, using a prescribed LD-ALEt process, a portion of the uniform film at a top and center of the feature, thereby leaving a coating at a bottom of the feature. These are followed by a third process step of using a different prescribed LD-ALD process to deposit a second film near the top of the feature, resulting in localized film coatings only at the top and bottom of the feature.

Additionally described is a process for fabricating a portion of a device having a trench or fin feature, which process includes a first process step of coating, using an ALD process having a CVD component, a CVD process, or a physical vapor deposition (PVD) process, a non-uniform thickness film on a surface of the feature, followed by a second process step of removing, using one or more cycles of a prescribed LD-ALEt process, a portion of the non-uniform film representing an undesired thickness of a localized area of the non-uniform film, thereby leaving a more uniform residue coating on the trench or fin feature Also described is a two-step process for locally reducing the thickness of a non-conformal film on a trench or Fin feature, the film being first coated with a non-uniform thickness film, followed by a second step using a prescribed LD-ALEt process having a limited number of cycles to remove part of the thickness of the coating, resulting in a more conformal residual coating on the trench or Fin feature.

Figure 1A:
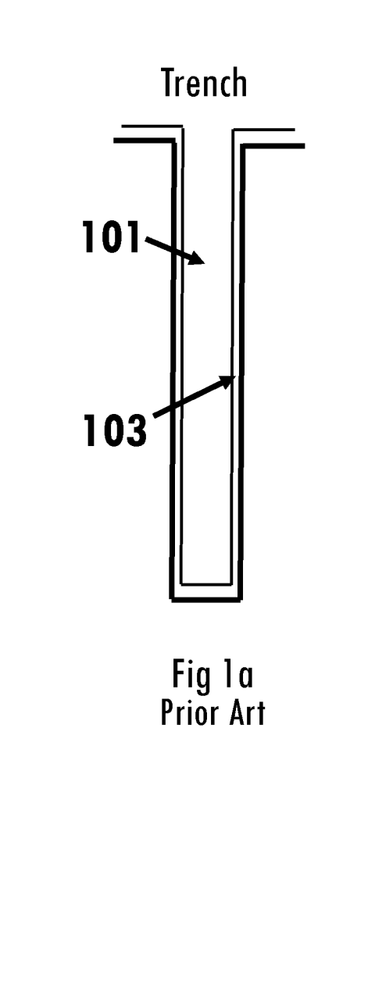
FIGS. 1a and 1b illustrate trench and Fin cross-section schema, respectively, conformally coated in accordance with conventional deposition processes.
Figure 1B:
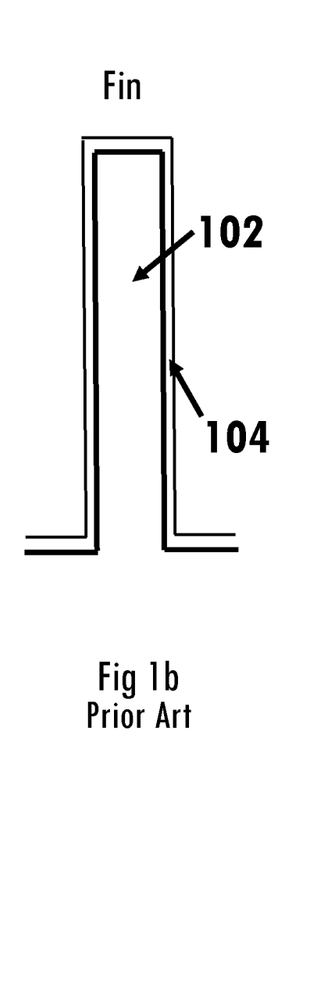

Referring now to FIGS. 1a and 1b, trench (101) and Fin (102) features are shown, respectively. Conventional ALD processes, using precursor doses near or above that required for surface saturation, provide conformal film coatings (103) and (104) over an entire vertical non-planar surface structure. These structures can be non-planar trenches, or arrays of trenches, or non-planar Fins, or arrays of Fins.

Figure 2A:
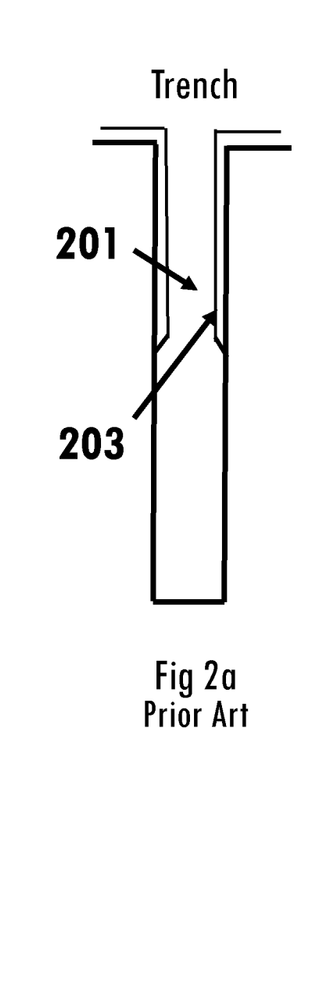
FIG. 2a illustrates a trench feature with a coating on the top using conventional limited dose deposition processes.
Figure 2B:
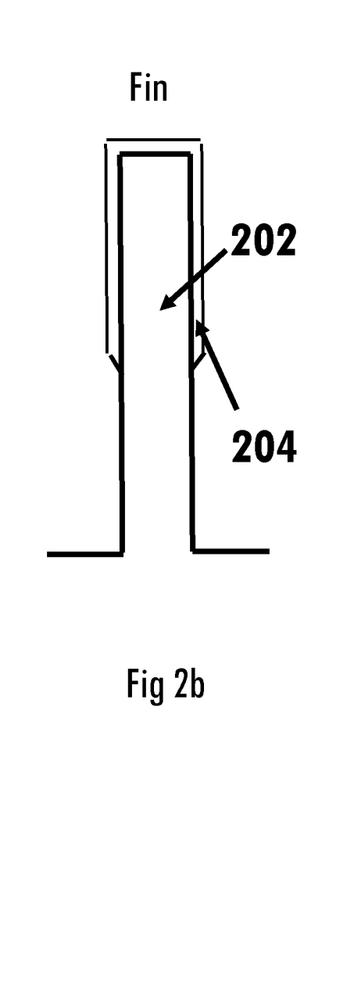
FIG. 2b illustrates a Fin feature with a coating on the top using limited dose deposition processes in accordance with embodiments of the present invention.

Limited dose ALD applied to trenches (201) is known to provide localized coatings (203) near the top of the structure, as illustrated in FIG. 2a. If the ALD dose is limited for a Fin structure (202), then localized coatings near the top of the Fin (204) would be expected as illustrated FIG. 2b.

Figure 3A:
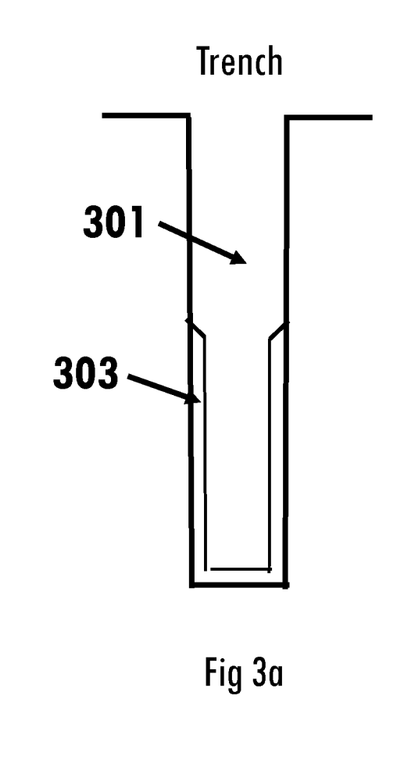
FIGS. 3a and 3b show trench and Fin features, respectively, with coatings on the bottom of the features made using limited dose deposition processes in accordance with embodiments of the present invention.
Figure 3B:
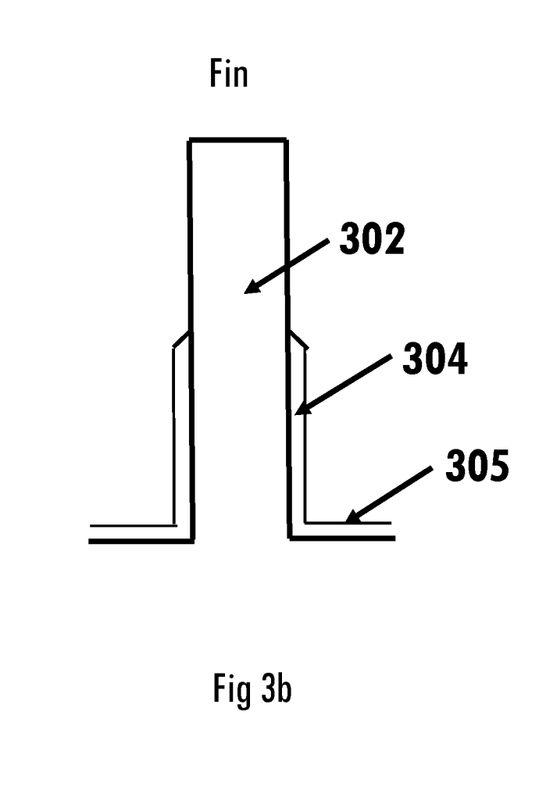

In one embodiment of the present invention, Atomic Layer Etching (ALEt) is used with limited precursor doses. This enables the removal of coatings near the top of trench and Fin features, as shown in FIGS. 3a and 3b, respectively. If a trench (301) were first coated uniformly with a conformal film by ALD or CVD, and an ALEt process is used to remove that film with a prescribed limited dose defined to remove only a specified coating near the top of the trench, then the trench (301) will be left with a specified remnant film coating near the bottom of the trench as shown in FIG. 3a (303). Similarly, if a Fin (302) were coated uniformly with a conformal film (by ALD or CVD processes), and followed by a prescribed limited ALEt dose, the Fin is coated to the desired height only near the bottom of the Fin feature (304), while also leaving a lower footer film (305), as shown in FIG. 3b. These are "two-step" sequential processes, where a conformal ALD or CVD step (not using a limited dose) is followed by a limited dose ALEt step.

Figures 4A, 4B:
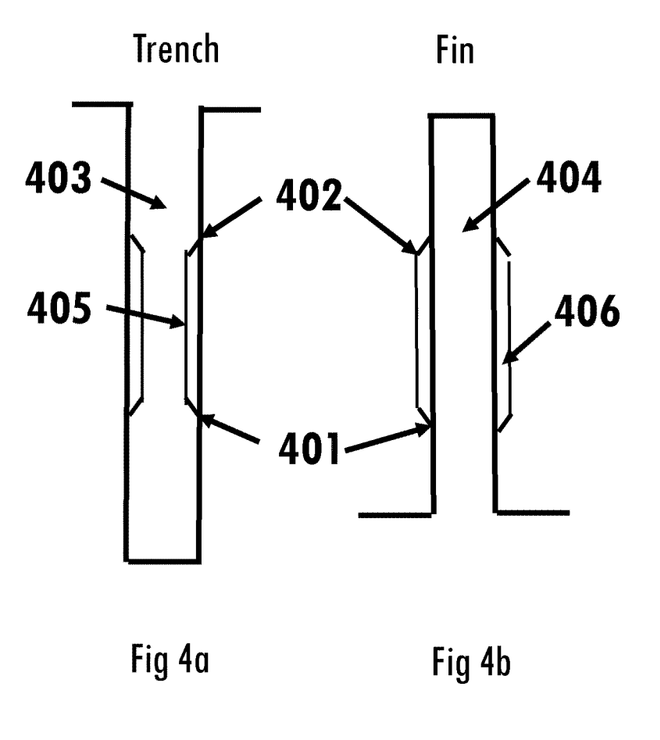
FIGS. 4a and 4b show trench and Fin features, respectively, with coatings in the middle of the features made using limited dose deposition processes in accordance with embodiments of the present invention.

As shown in FIGS. 4a and 4b, a trench (403) or a Fin (404) may be coated only in the center of a non-planar feature. To obtain a coating only in the center of a non-planar feature, a prescribed limited dose ALD process is used to first coat the feature only near the top and center (but to a specified distance from the top) of the feature. This is followed by an ALEt of a different prescribed limited dose, to remove the coating only near the top of the features down to a specified top of the center features (402). The result is a localized coating left on the center of a trench (405) or Fin (406), having specified top (402) and bottom (401) locations. The prescribed limited doses for trench and Fin would be quantitatively different. This is a "two-step" sequential process, one where a limited dose ALD step is followed by a limited dose ALEt process.

Figures 5A, 5B:
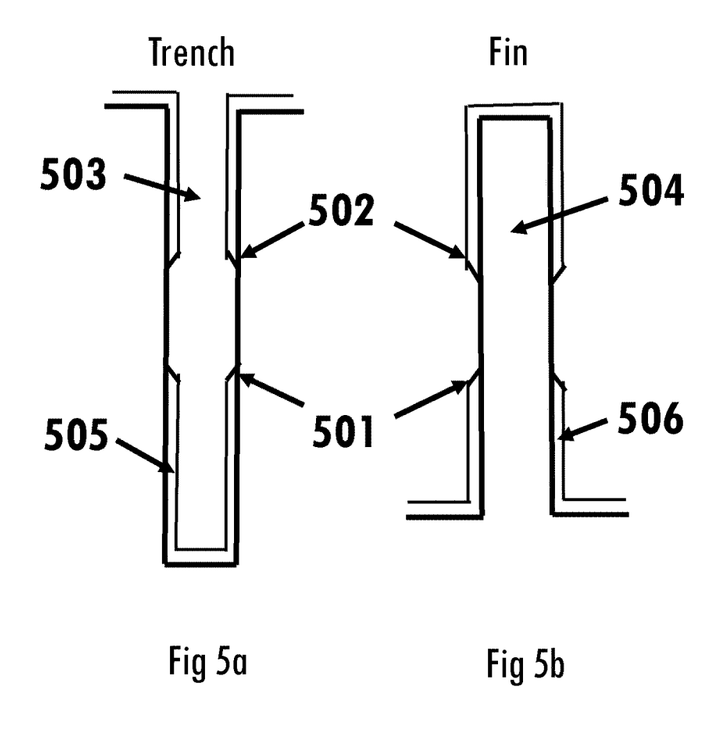
FIGS. 5a and 5b show trench and Fin features, respectively, with coatings at the top and bottom of the features made using limited dose deposition processes in accordance with embodiments of the present invention.

Also, as shown in FIGS. 5a and 5b, process sequences leaving no coating in the center of the vertical, non-planar features for trenches and Fins can be achieved. A conformal uniform coating of the features is first deposited everywhere using ALD (or CVD), as in FIGS. 1a and 1b. This is followed by a prescribed limited dose ALEt process to remove the film near the top and center location of the features, leaving a bottom coating for trench (505) or Fin (506) features. The upper extent of the bottom coating is at a specified lower location (501) for trench and Fin. This is followed by a different prescribed limited dose ALD process to coat only the top of the trench (503) or Fin (504) having a lower location to a specified location (502). This is a "three-step" sequential process, one where a totally conformal ALD film is followed by a limited dose ALEt step removing the coating in the top and center of the feature, followed by a limited Dose ALD step to deposit a coating on the top of the feature.

Figure 6:
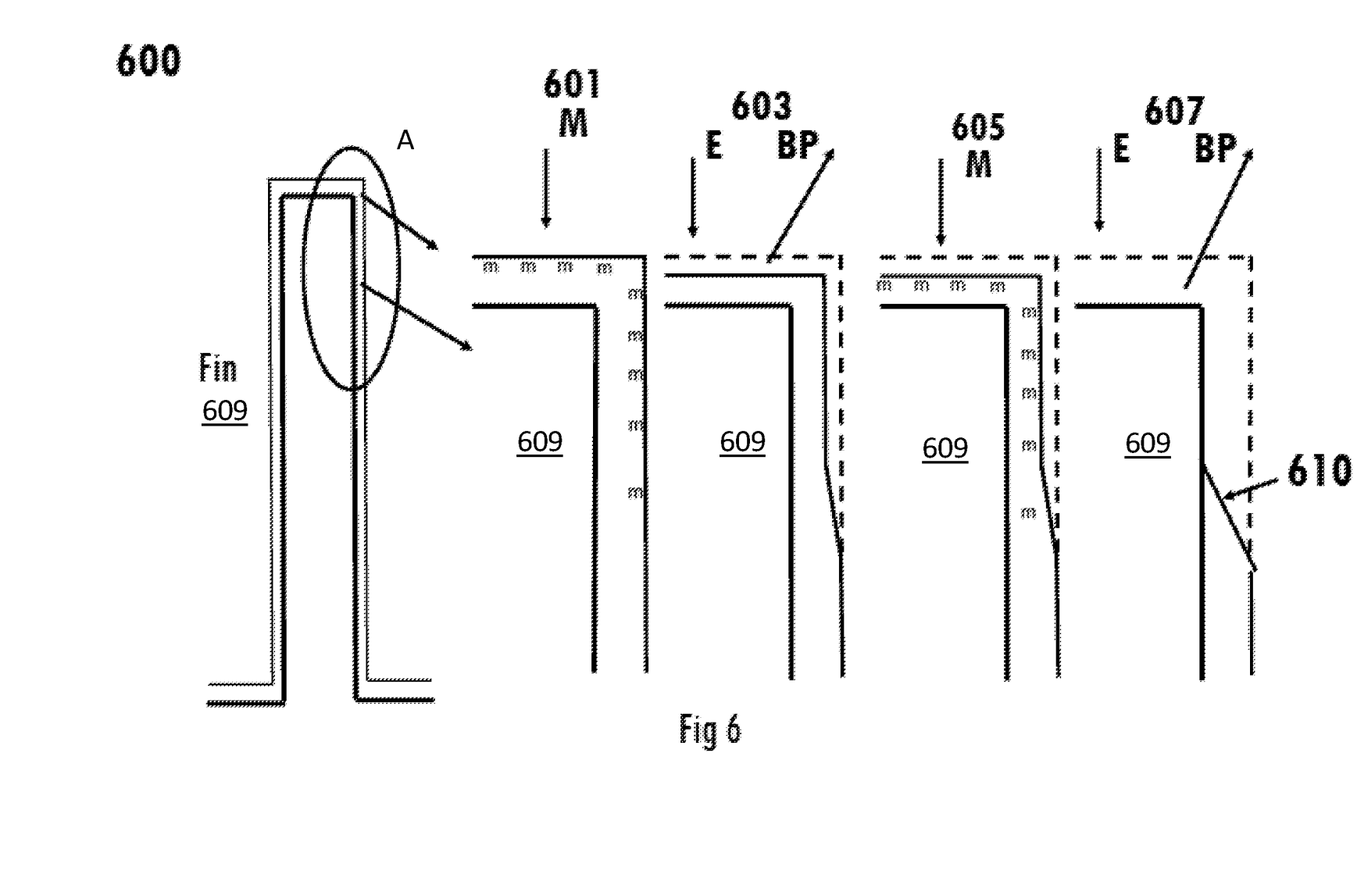
FIG. 6 is an illustration of a limited dose ALEt process in accordance with embodiments of the present invention, showing the location of surface modifying precursors, the effect of the etching step, and the taper in film thickness.

Referring now to FIG. 6, a process (600) for limited dose ALD etching of a conformal coating on a Fin (609) is described. In the illustration, views (i) to (iv) illustrate details of highlighted area A of the Fin at different times of the overall process. Precursor modification molecules M (601) transport from a source above the device substrate toward a substrate having, in this case, a non-planar Fin feature (609). Using a limited dose, modification molecules M (e.g., HF for etching $Al_2O_3$) are chemisorbed (illustrated as "m") in the film near the top surface of the feature and prepare the upper surface for the etch reaction (603). Once the top surface of the feature is modified, exposure to an etch precursor, E (e.g., TMA for $Al_2O_3$ etching), removes a nominal monolayer in the byproduct, BP. The modification and etch process is repeated (603, 605) until the film is removed (607) near the top of the feature, leaving a taper (610) at the lower edge of the locally etched film.

A precursor with a high sticking coefficient would have reactions taking place "top-down" with a relatively small taper near the lower edge of the modified reaction surface. A precursor with a low sticking coefficient would have reactions distributed vertically and have a more gradual taper. It may be possible to program a reduced dose of the M precursor, cycle to cycle, to ensure the etching does not proceed at a lower vertical position than desired. A repeated low dose of a high sticking coefficient precursor would result in achieving more complete local saturation on the feature. If two different etching chemistries are available, the higher sticking coefficient, or the more rapidly saturating modifying reaction would be desired.

ALD or AlEt chamber design for the limited dose applications would preferably be a single wafer shower head design with circular symmetry which strives to deliver the same dose to the wafer at all points at the same time. This is preferred for limited dose ALD as well as limited dose ALEt.

Two methods for precisely controlling and delivering reproducible values of the limited doses for ether LD-ALEt (or LD-ALD) are described. A preferred method of delivering the limited dosing of precursors would be to have the precursor source held at a known fixed pressure, P, and monitoring with a pressure regulator, so that when the precursor is delivered to the chamber directed toward a substrate, the limited dose delivered is controlled by the time the fast gas switching valve is open from a constant pressure source.

An alternate method uses a precursor "charge" volume prepared with a specific total number of precursor molecules. The number of precursor molecules available for delivery to the device on a workpiece substrate is given by the gas law, N=PV/RT, where P is the initial precursor pressure, V is the volume of the charge tube, T is the absolute temperature, and R is the gas constant. To implement a limited dose, a fast gas switching valve attached between the charged tube and the reaction chamber (at relatively lower pressure) holding the workpiece is opened, and the limited precursor dose is delivered to the workpiece. In practice, the valve would be closed after ~70-90% of the charge is delivered for better productivity. In either case, one would operate a source system reproducibly.

It is also important to prepare the process chamber with surfaces that are similar over many depositions, because, in this approach, the chamber parasitic surfaces will also be sinks for the precursors. One might use ALD or ALEt to precondition the chamber surfaces before running a limited dose process. This may be achieved by using precursors to reset the surface ligands of the parasitic surfaces that are non-reactive to the device wafer process, if known. A reactor conditioning process may use saturating doses of appropriate ALD or ALE processes, so competing parasitic surfaces are the same, wafer to wafer.

The sticking coefficient of the surface "modification" precursor used in the ALEt process may play a role in the result of exposure. If the sticking coefficient is relatively high, the modification precursor step might be done in a single exposure, and reaction will proceed in the feature from the top and stop saturating at the desired distance from the top of the feature. If the sticking coefficient is low, the modification quality will be incomplete, and long or multiple repeated short time doses might be used. In any case, the lower "edge" of the modified surface will have some taper. If modification precursors with higher sticking or reaction coefficients are available for the same film to be etched, the faster reacting precursor would be preferred.

The methodology for obtaining a prescribed limited dose to obtain an objective i.e., to etch (or deposit) to a specified location would be to select a limited dose value less than that which etches (or deposits) the entire film of interest in a planar case. One may use as a starting value, half of the nominal "saturation" dose for etching a planar film. Once the amount of vertical film to be etched (or deposited in the case of limited dose ALD) is determined using a specified dose, the dose may be adjusted up or down to obtain the etched (or deposited) film vertical value of interest. It may also be useful to change the magnitude of dose as sequential pulses are applied to assure that the feature is etched only near the top of the feature.

A description of the term "non-planar feature" is appropriate. The cross-section views (FIGS. 1a thru 5b) illustrate the trench structure with a "large" aspect ratio. Trench aspect ratios of the order of or greater than 100 are often used. In the case of a Fin, the length is larger than the height, which is larger than its width, as is usually seen for FinFET designs having a rectilinear cross-section. Aspect ratios of 10 are common and will scale to higher values in the future. The Figures are representations of cross sections of 3-dimensional structures. The surfaces illustrated herein were all "vertical". However, surfaces off-vertical, or at angles off-horizontal, are "non-planar" and any surfaces not on the horizontal plane may apply and are included in the scope of "non-planar."

In the case of a trench of rectilinear design, the ends of the structure that is in front (out of the page) and behind (into the page of FIGS. 1a-5b) may behave differently. The extent and location of vertical coatings may be different near the ends of the rectilinear trench compared with the surfaces away from the ends. The issue will not apply to circular or a more equal sided top geometry structure. In dense trench structures, the design layout is the same around a typical trench. In the case of Fins, the end Fins will be in a different device layout environment than the Fins in the interior of the Fin array.

To illustrate the combined limited dose ALEt and ALD approach, two examples for FinFETs and one for Microstructured Neutron Detectors are described.

Figure 8A:
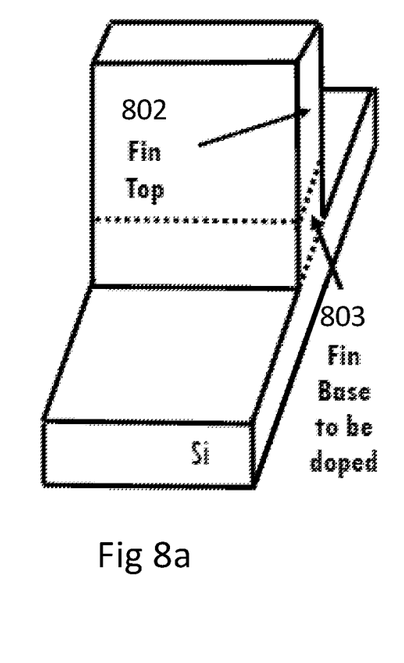
FIG. 8a is an isometric illustration of a silicon Fin, with the lower space designated for doping the Fin base.
Figure 8B:
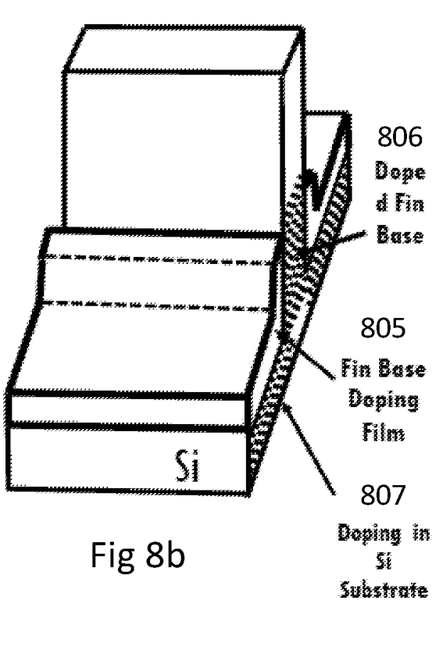
FIG. 8b is an isometric illustration of a silicon Fin, with the Fin base doped from out diffusion from an ALEt doped film.
Figure 8C:
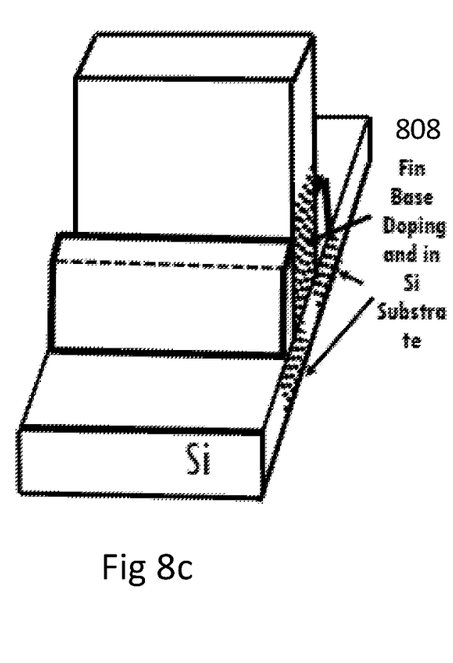
FIG. 8c is an isometric illustration of a silicon Fin, with the Fin base doped from out diffusion from a thermal ALEt doped film after removal of the extended base doping film.

In the case of FinFETs, using a silicon-based Fin, the base of the Fin may be doped with opposite type than the channel to provide junction isolation. This is illustrated in FIGS. 8a, 8b and 8c. The Fin is formed by processes known in the art using oxide-nitride layering, photomasking, and silicon etch steps. The result is a structure illustrated in FIG. 8a. The figure shows the top of the Fin (802) and bottom of the Fin (803) to be counter-doped for junction isolation. A conformal doped film, may be first deposited by non-dose limited, saturated dose ALD to conformally cover the Fin. This is followed by a limited dose ALEt of the oxide film to remove the top of the doped source layer over the top of the Fin, leaving a doping film at the Fin Base (805). The result is shown in FIG. 8b. After a thermal out-diffusion step, the dopant in the doped oxide diffuses into the Base region below the channel region all along the length of the Fin, labeled "Doped Fin Base" (806). Doping also is placed in the silicon substrate under the extended base doping film (807). If dopant diffusion under the extended base doping part of the doping film is undesired, it may be removed by an additional anisotropic etching step prior to thermal out-diffusion. The result is shown in FIG. 8c where the doping in the substrate is localized (808). The dotted area represents the dopant in the Fin Base and substrate. For N-channel FinFET devices, the base isolation doping may use B, Ga or In. For P-channel FinFET devices, the base isolation may use P, As or Sb.

A FinFET process flow may thus include the following steps: 1. Fin Formation, 2. Base Junction Isolation Doping (as described above), 3. CVD Oxidation, CMP, Ox etch, 4. HiK Dielectric/Metal Gate (Option) deposition on the Fin, 5. Gate Deposition, 6. LDD, Gate Spacer, 7. Source-Drain Doping (refer to FIG. 9) and 8. Metalization and Contact.

Figure 9:
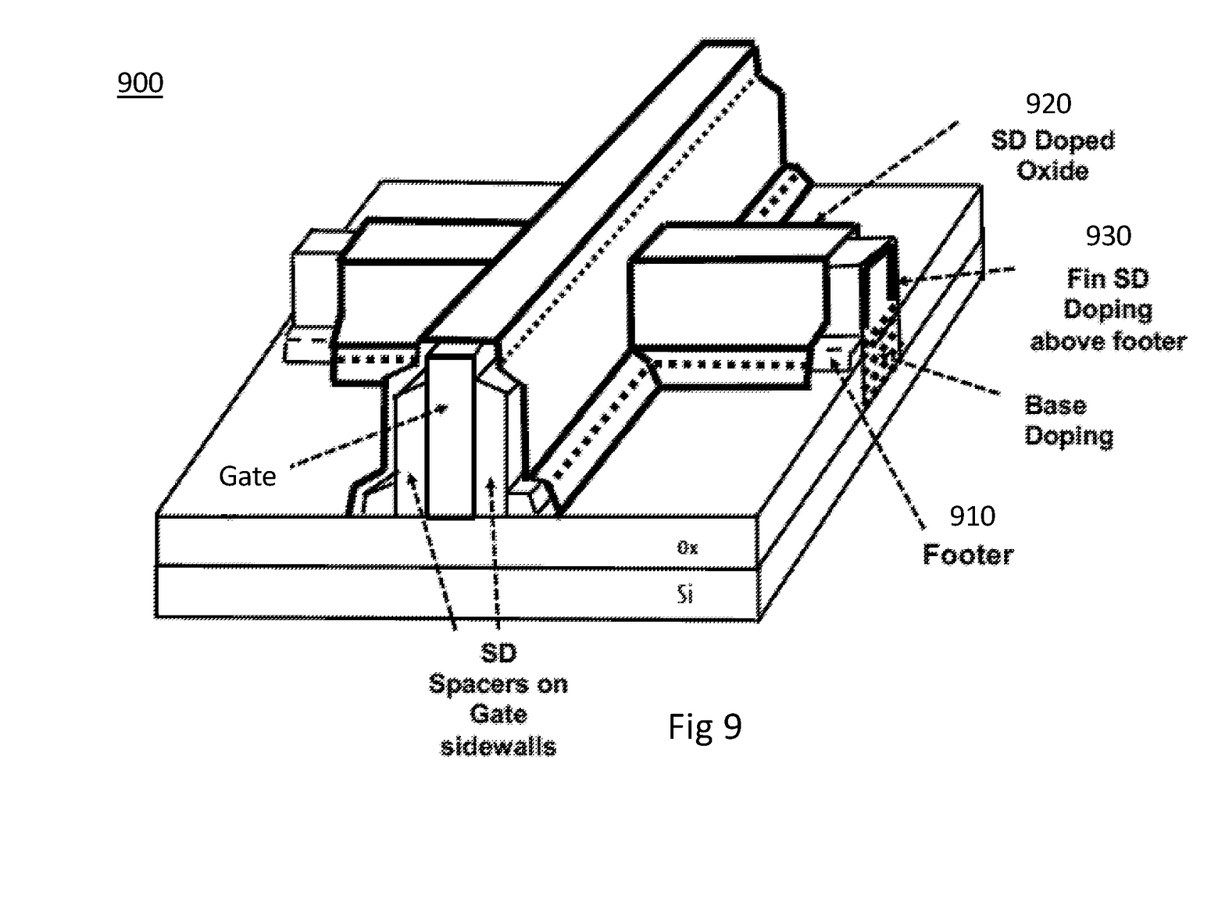
FIG. 9 is an isometric drawing of a FinFET device, having base junction isolation doping and an elevated source-drain.

In FIG. 9, a FinFET (900) is illustrated with various cut-away layers to show a Source-Drain Doping process using a limited dose ALE to place an undoped $SiO_2$ or SiN "footer" (910) at the base of the Fin. The footer serves to space the Source Drain doping above the Base doping in the Fin. The footer film (910) may be obtained using a limited dose ALEt step followed by an anisotropic etch to clear the extended flat film. (This is similar to the optional sequence used to clear the extended flat oxide (807) shown in FIG. 8b.) The source-drain doping is carried out from a doped oxide conformally covering the entire FinFET (920), ensuring little or no compensation of Source Drain doping and the base isolation doping, as the Source-Drain doping (930) is above the footer (910).

Solid-state Microstructured Neutron Detectors have alternating straight walled trenches and silicon Fins. The trenches are filled with neutron absorber material. The Fins are coated with dopants and form an imbedded parallel array of PIN diode detectors. Under neutron absorption, the absorber material emits an alpha particle with enough energy to reach the depletion region of the detector and generate a signal. However, some alpha particles are back-emitted and do not reach the detector and limit detection efficiency.

Figure 10:
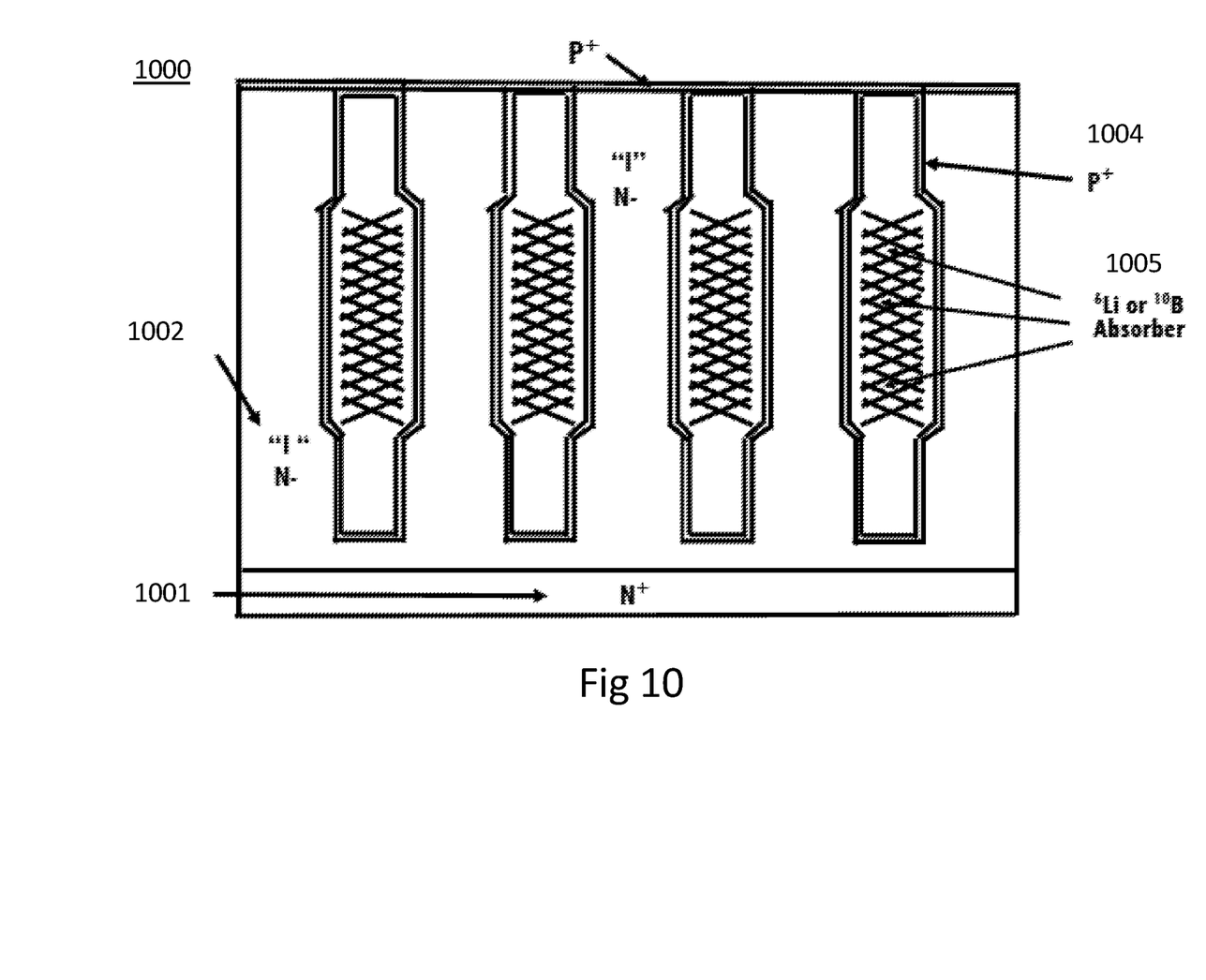
FIG. 10 is a cross-section of a Solid-State Microstructured Neutron Detector with the top and bottom narrower than the center.

To partially overcome this issue, a bottle trench structure (1000) may be made as shown in FIG. 10. The substrate is doped N+(1001) and body of the PIN is N− (1002) while the surface of the Fins and the top surface is P+ doped (1004). The trench bottle structure may be fabricated by etching trenches having mask coatings on the top and bottom of the inside wall of the trenches. The uncoated center section is further etched to form the larger bottle space dimensions. The bottle trench design has smaller dimensions at the top and bottom of the trench and the PIN detector has larger dimensions at the top and bottom of the PIN regions. The trenches are filled with neutron absorber material, such as $^6$Li or $^{10}$B (1005).

Alpha particles back directed have a better chance of reaching the contoured PIN region and the efficiency may be improved by a few percent.

In summary, LD-ALEt processes in combination with fully dosed ALD and LD-ALD may be used to deposit localized coatings on non-planar surfaces such as the top, center or bottom as trenches, Fins and re-entrant features.

Figure 7A:
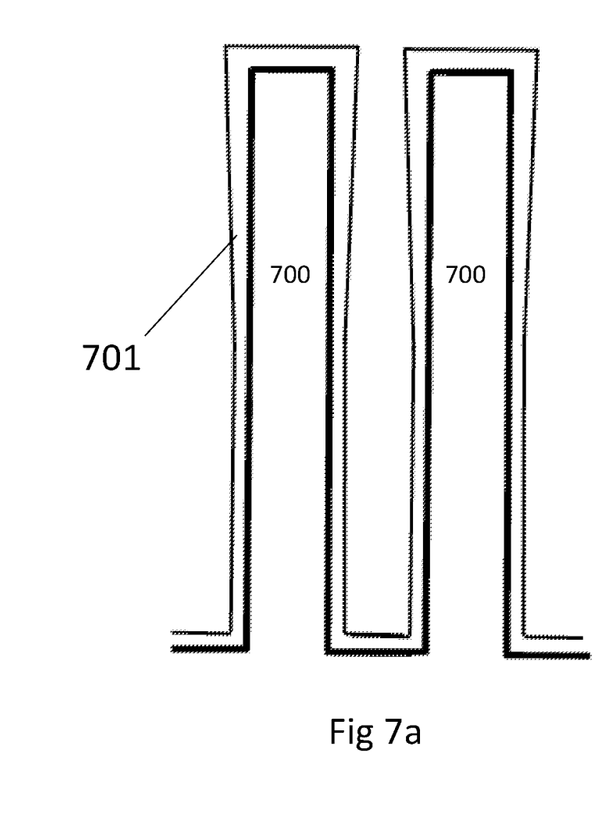
FIGS. 7a and 7b show before (FIG. 7a) and after (FIG. 7b) views of a film on a trench or Fin feature of a semiconductor device, in which LD-ALEt processes are used to reduce, in localized areas (near the top of the feature), the thickness of the film.
Figure 7B:
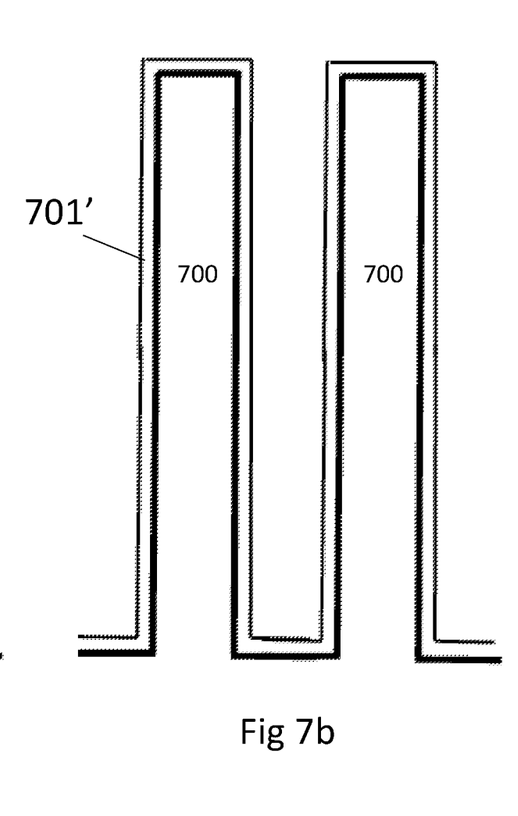

Referring now to FIGS. 7a and 7b, in addition to depositing localized coatings LD-ALEt processes may be used to reduce, e.g., in localized areas, the thickness of a non-conformal film on a trench or fin feature. For example, as shown in FIG. 7a, a condition may exist where a film (701) is thicker at the top of a non-planar feature such as a trench or fin (700), which may result from using a non-ideal ALD process having a CVD component, or a CVD process, or a PVD process. If the thicker film is undesirable, for example limiting an intended application, a limited dose ALE process may be used to remove part of the thickness of the film near the top of a feature to achieve better conformality. This would be done by using a limited number of cycles of the limited dose ALE process. The prescribed number of cycles, in this case, would remove substantially the additional undesired thickness, resulting in an improvement in overall conformality of the deposited layer (701') from that which previously existed, as shown in FIG. 7*b*. The use of precursors having a relatively larger sticking coefficient, if available, may be useful, affecting the taper in an ALE etched surface to be gradual. The use of precursors having relatively smaller molecular size, if available, might be more useful to limit surface roughness for this limited dose, limited cycle ALE process.

Thus, descriptions of the uses of Limited Dose Atomic Layer Etching, in combination with ALD, Limited Dose ALD, and Atomic Layer Etching and the use of various sequences of those processes provide pathways for forming localized coatings on the surfaces of non-planar devices have been provided. Various modifications and applications may occur to those skilled in the art without departing from the spirit and scope of the invention as defined in the appended claims.

What is claimed is:

1. A process for fabricating a portion of a device having a non-planar trench or Fin feature, comprising: a first step of coating said feature with a uniform thickness film by a first atomic layer deposition (ALD) or conformal chemical vapor deposition (CVD) process, followed by a second step of removing at least a portion of said film near a top of the feature using a prescribed Limited Dose Atomic Layer Etching (LD-ALEt) process, said LD-ALEt process characterized as a dose less than that required to allow reacting chemical precursors to reach a bottom or remote locations of the feature, thereby leaving a residual film coating only near the bottom of the feature.

2. A process for fabricating a portion of a device having a non-planar trench or Fin feature, comprising a first step of coating, using a prescribed Limited-Dose atomic layer deposition (ALD) process, the feature with a film only near a top and center of the feature, said Limited-Dose ALD process characterized as a dose less than that required to allow reacting chemical precursors to reach a bottom or remote locations of the feature, followed by a second step of using a different prescribed Limited Dose Atomic Layer Etching (LD-ALEt) process to remove a portion of the film at a top of the feature, thereby leaving a localized film coating only near a center of the feature, said LD-ALEt process characterized as a dose less than that required to allow reacting chemical precursors to reach the bottom or remote locations of the feature.

3. A three-step process for fabricating a portion of a device having a non-planar trench or Fin feature, comprising a first process step of coating, with a first conformal atomic layer deposition (ALD) process, a uniform film on a surface of the feature, followed by a second process step of removing, using a prescribed Limited Dose Atomic Layer Etching (LD-ALEt) process a portion of the uniform film at a top and center of the feature, thereby leaving a coating at a bottom of the feature, said LD-ALEt process characterized as a dose less than that required to allow reacting chemical precursors to reach the bottom or remote locations of the feature, and followed by a third process step of using a different prescribed Limited-Dose ALD process to deposit a second film near the top of the feature, resulting in localized film coatings only at the top and bottom of the feature said Limited-Dose ALD process characterized as a dose less than that required to allow reacting chemical precursors to reach the bottom or remote locations of the feature.

4. A process for fabricating a portion of a device having a trench or fin non-planar feature, comprising a first process step of coating, using an atomic layer deposition (ALD) process having a chemical vapor deposition (CVD) component, a CVD process, or a physical vapor deposition (PVD) process, a non-uniform thickness film on a surface of the non-planar feature, followed by a second process step of removing, using one or more cycles of a prescribed Limited Dose Atomic Layer Etching (LD-ALEt) process, said LD-ALEt process characterized as a dose less than that required to allow reacting chemical precursors to reach a bottom or remote locations of the feature, only that portion of the non-uniform film representing an undesired thickness of a localized area of the non-uniform film and not portions of the film outside of the localized area, thereby leaving a more uniform residue coating on the trench or fin the non-planar feature.

5. The process of claim 4, wherein the first process step coats the non-uniform thickness film thicker at a top of the non-planar feature than elsewhere on the non-planar feature.

* * * * *